United States Patent
Thompson et al.

[19]

[11] Patent Number: 6,045,930
[45] Date of Patent: Apr. 4, 2000

[54] MATERIALS FOR MULTICOLOR LIGHT EMITTING DIODES

[75] Inventors: Mark E. Thompson, Anaheim Hills, Calif.; Jon A. Cronin, Cordova, Tenn.; Stephen R. Forrest, Princeton; Paul Burrows, Princeton Junction, both of N.J.

[73] Assignees: The Trustees of Princeton University, Princeton, N.J.; The University of Southern California, Los Angeles, Calif.

[21] Appl. No.: 08/850,264

[22] Filed: May 2, 1997

Related U.S. Application Data

[63] Continuation of application No. 08/771,815, Dec. 23, 1996, abandoned, which is a continuation of application No. 08/814,976, Mar. 11, 1997, abandoned.

[51] Int. Cl.$^7$ ..................................................... H05B 33/13
[52] U.S. Cl. ........................ 428/690; 428/691; 428/917; 313/504; 313/506
[58] Field of Search .................................. 428/690, 691, 428/917; 313/504, 506

[56] References Cited

U.S. PATENT DOCUMENTS

| | | |
|---|---|---|
| 4,950,950 | 8/1990 | Perry et al. . |
| 5,294,869 | 3/1994 | Tang et al. . |
| 5,294,870 | 3/1994 | Tang et al. . |

FOREIGN PATENT DOCUMENTS

WO 96/19792   6/1996   WIPO .

OTHER PUBLICATIONS

S.R. Forrest, Burrows, Thompson, "Organic Emitters Promise a New Generation of Displays", Laser Focus World, Feb. 1995.

J. Kido, M. Kimura, K. Nagai, "Multilayer White Light–Emitting Organic Electroluminescent Device" Science vol. 267, 1332 (Mar. 1995).

A. Dodabalapur et al., "Microcavity Effects in Organic Semiconductors" Appl. Phys. Lett., vol. 64, 2486 (May 1994).

M. Granstrom et al., "White Light Emission froma Polymer Blend Light Emitting Diode" Appl. Phys. Lett. vol. 68, 147 (Jan. 1996).

(List continued on next page.)

*Primary Examiner*—Charles Nold
*Attorney, Agent, or Firm*—Kenyon & Kenyon

[57] ABSTRACT

Disclosed herein are organic light emitting devices in which emitting layers (EL) comprise a suitable receiving compound according to Formulas I and II:

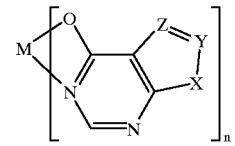

I wherein M is an ion of a divalent or trivalent metal atom, wherein n=3 when M is trivalent, and n=2 when M is divalent, wherein the metal atom is selected from the group consisting of aluminum, gallium, indium, and zinc, and wherein X, Y, and Z are each individually and independently C or N, such that at least two of X, Y and Z are N; and

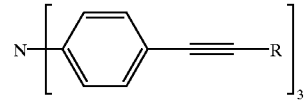

II wherein R is alkyl, phenyl, substituted alkyl, substituted phenyl, trimethylsilyl, or substituted trimethylsilyl.

Also disclosed are OLED's utilizing device elements comprising the above compounds and display devices based on those OLED's.

11 Claims, 5 Drawing Sheets

OTHER PUBLICATIONS

B.O. Dabbousi et al., "Electroluminescence from CdSe Quantum–dot/polymer Composites" Appl. Phys. Lett., vol. 66, 1316 (Mar. 1995).

V.L. Colvin et al., , "Light–emitting Diodes Made From Cadmium Selenide Nanocrystals and a Semiconducting Polymer", Nature 370, 354 (1994).

Depp, et al., "Flat Panel Displays," Scientific American, Mar. 1993, 90–97.

ligand = 4-hydroxypyrazolo[3,4-d]pyrimidine ligand = hypoxanthine ligand = azaguanine

MATERIALS FOR MULTICOLOR LIGHT EMITTING DIODES

This application is a continuation of Ser. No. 08/771,815 filed Dec. 23, 1996, now abandoned, which is a continuation of Ser. No. 08/814,976, filed Mar. 11, 1997, now abandoned.

FIELD OF THE INVENTION

This invention relates, in general, to multicolor organic light emitting devices (OLED's) and, more particularly, to combinations of dopants and host compounds used in the fabrication of such devices that enable the generation of electroluminescence over a range of wavelengths that render the devices suitable for use in, for example, flat panel electronic displays.

BACKGROUND OF THE INVENTION

Electronic display devices are becoming an increasingly indispensable tool in modern society for the delivery of visual information. These devices find widespread utility in television sets, computer terminals, and in a host of related applications. No other type of technology offers comparable speed, versatility and potential for interactivity. Current electronic display technologies include, for example, cathode ray tubes (CRT's), plasma displays, light emitting diodes (LED's), thin film electroluminescent displays, and the like.

The most widely-used non-emissive technology for display devices makes use of the electro-optic properties of a class of organic molecules known as liquid crystals in fabricating liquid crystal displays (LCD's). LCD's operate fairly reliably, but are limited by relatively low contrast and resolution, and the requirement for high power backlighting. As a partial solution to these shortcomings, active matrix displays employ an array of transistors, each capable of activating a single liquid crystal pixel.

There is no doubt that flat panel display technology is of significant scientific and commercial interest. Consequently, it is the subject of extensive ongoing research. See Depp, S. W. and Howard, W. E., "Flat Panel Displays," *Scientific American*, March 1993, pps. 90–97. According to Depp and Howard, by 1995, flat panel displays alone were expected to generate a market of between $4 and $5 billion. Key to the success of any potential display technology in this market is the ability to both provide a high resolution, full-color display at good light level and, at the same time, to be competitively priced.

Organic thin film materials represent a technical development that has demonstrated considerable progress in the fabrication of red, green and blue light emitting devices. These organic light emitting devices have been shown to have sufficient brightness, range of color and operating lifetimes for use as a practical alternative technology to LCD-based full color flat-panel displays (S. R. Forrest, et al., *Laser Focus World*, February 1995). Furthermore, since many of the organic thin films used in such devices are transparent in the visible spectral region, they potentially allow for the realization of a completely new type of display pixel in which the red (R), green (G), and blue (B) emission layers are placed in a vertically stacked geometry to provide a simple fabrication process, minimum R-G-B pixel size, and maximum fill factor.

It is believed by the inventors of the instant disclosure that ideas that have been disclosed for using separate, side-by-side R, G, B OLED's to make a full color display (C. W. Tang and J. E. Littman, U.S. Pat. No. 5,294,869 (1994)) have not been realized in a practical device.

Such schemes suffer from a complex layer structure, and lack of known methods for damage-free, post-deposition patterning of organic layers at the resolution required for color displays. Others have alternatively suggested using an array of white OLED's (J. Kido, et al., *Science* 267, 1332 (1995)) backed by side-by-side R, G and B color filters deposited and patterned prior to OLED growth. However, such a design sacrifices at least 66% of the light from each white OLED, with the remainder being absorbed in the filter, also generating heat. Such a design suffers, therefore, from low efficiency and conditions of accelerated degradation. Alternative schemes based on microcavity filtering of a broad-spectrum OLED (A. Dodabalapur, et al., *Appl. Phys. Lett.* 64, 2486 (1994)) suffer from complex and expensive substrate patterning requirements and extremely limiting directionality of the resulting color pixels.

Published examples of tunable OLED's utilize a blend of either two polymers (M. Granstrom and O. Inganas, *Appl. Phys. Lett.* 68, 147 (1996)) or a polymer doped with semiconductor nanocrystallites (B. O. Dabbousi, et al., *Appl. Phys. Lett.* 66, 1316 (1995); V. L. Colvin, et al., *Nature* 370, 354 (1994)). Each component of the blend emits radiation having a different spectral energy distribution. The color is tuned by varying the applied voltage. A higher voltage results in more emission from the higher bandgap polymer, which emits radiation toward the blue region of the spectrum, while also resulting in higher overall brightness due to increased current injection into the device. Although tuning from orange to white has been demonstrated, incomplete quenching of the low-energy spectral emission appears to prohibit tuning completely into the blue. In addition, emission intensity can only be controlled by using pulsed current and reduced duty cycles. In a color display, therefore, prohibitively high drive voltages and very low duty cycles may be necessary for blue pixels. This necessitates a complex driver circuit, renders passive matrix operation extremely difficult, if not impossible, and is likely to accelerate degradation of the display.

A transparent organic light emitting device (TOLED) which represents a first step toward realizing high resolution, independently addressable stacked R-G-B pixels has been reported recently in the published international application No. WO 92/19792. This TOLED had greater than 71% transparency when turned off, and emitted light from both top and bottom device surfaces with high efficiency (approaching 1% quantum efficiency) when the device was turned on. The TOLED used transparent indium tin oxide (ITO) as the hole-injecting electrode layer, and a Mg:Ag—ITO layer for electron injection. A device was disclosed in which the Mg:Ag—ITO electrode was used as a hole-injecting contact for a second, different color-emitting OLED stacked on top of the TOLED. Each device in the stack was independently addressable and emitted its own characteristic color through the transparent organic layers, the transparent contacts and the glass substrate allowing the entire device area to emit any combination of color that could be produced by varying the relative output of the two color-emitting layers.

Thus, for the specific device disclosed in WO 92/19792, which included a red-emitting layer and a blue-emitting layer, the color output produced by the pixel could be varied in color from deep red through blue.

It is herein believed that WO 92/19792 provided the first demonstration of an integrated OLED where both intensity and color could be independently varied by using external current sources. As such, WO 92/19792 represents the first proof-of principle for achieving integrated, full color pixels which provide the highest possible image resolution (due to the compact pixel size) and low cost fabrication (due to the elimination of the need for side-by-side growth of the different color-producing pixels).

Presently, the most favored high-efficiency organic emissive structure is referred to as the double heterostructure LED which is known to those of skill in the appropriate art. This structure is very similar to conventional, inorganic LED's using materials as GaAs or InP. In this type of device, a support layer of glass is coated by a thin layer of indium/tin oxide (ITO) to form the substrate for the structure. Next, a thin (100–500 Å) organic, predominantly hole-transporting, layer (HTL) is deposited on the ITO layer. Deposited on the surface of HTL layer Is a thin (typically, 50–100 Å) emissive layer (EL). If these layers are too thin, there may be breaks in the continuity of the film; as the thickness of the film increases, the internal resistance increases, requiring higher power consumption for operation. The emissive layer (EL) provides the recombination site for electrons, injected from a 100–500 Å thick electron transporting layer (ETL) that is deposited upon the EL, and holes from the HTL layer. The ETL material is characterized by considerably higher mobility for electrons than for charge deficient centers (holes). Examples of prior art ETL, EL and HTL materials are disclosed in U.S. Pat. No. 5,294,870 entitled "Organic Electroluminescent MultiColor Image Display Device," issued on Mar. 15, 1994 to Tang et al., the disclosure of which is hereby incorporated by reference.

Often, the EL layer is doped with a highly fluorescent dye to tune the frequency of the light emitted (color), and increase the electroluminescence efficiency of the LED. The double heterostructure device described above is completed by depositing metal contacts onto the ITO Layer, and a top electrode onto the electron transporting layer. The contacts are typically fabricated from indium or Ti/Pt/Au. The electrode is often a dual-layer structure consisting of an alloy such as Mg:Ag directly contacting the organic ETL layer, and a thick, opaque second layer of a high work function metal such as gold (Au) or silver (Ag) on the Mg:Ag. When proper bias voltage is applied between the top electrode and the metal contacts, light emission occurs through the glass substrate. An LED device of this type typically has luminescent external quantum efficiencies of from 0.05 percent to 4 percent depending on the color of emission and the device structure.

Another known organic emissive structure is referred to as a single heterostructure. The difference in this structure relative to that of the double heterostructure is that the electroluminescent layer also serves as an ETL layer, eliminating the need for the ETL layer. However, this type of device, for efficient operation, must incorporate an EL layer having good electron transport capability, otherwise a separate ETL layer must be included, rendering the structure effectively the same as a double heterostructure.

Presently, the highest efficiencies have been observed in green LED's. Furthermore, drive voltages of 3 to 10 volts have been achieved. These early and very promising demonstrations have used amorphous or highly polycrystalline organic layers. These structures undoubtedly limit the charge carrier mobility across the film which, in turn, limits current and increases drive voltage. Migration and growth of crystallites arising from the polycrystalline state is a noted failure mode of such devices. Electrode contact degradation is also a common mechanism of failure.

A known alternative device structure for an LED is referred to as a single layer (or polymer) LED. This type of device includes a glass support layer coated by a thin ITO layer, forming the base substrate. A thin organic layer of spin-coated polymer, for example, is then formed over the ITO layer, and provides all of the functions of the HTL, ETL, and EL layers of the previously described devices. A metal electrode layer is then formed over the organic polymer layer. The metal is typically Mg, Ca, or other conventionally used metals.

Devices whose structure is based upon the use of layers of organic optoelectronic materials generally rely on a common mechanism leading to optical emission. Typically, this mechanism is based upon the radiative recombination of a trapped charge. Specifically, devices constructed along the lines discussed above comprise at least two extremely thin organic layers separating the anode and cathode of the device. The material of one of these layers is specifically chosen based on the material's ability to transport holes (the HTL layer); the other, according to its ability to transport electrons (the ETL or EL layer). This last layer typically comprises the electroluminescent layer. With such a construction, the device can be viewed as a diode with a forward bias when the potential applied to the anode is higher than the potential applied to the cathode. Under these bias conditions, the anode injects holes (positive charge carriers) into the electroluminescent layer, while the cathode injects electrons into the EL layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. This results in hole-electron recombination within the EL layer. Upon recombination to form a short-lived Frankel exciton, a migrating electron drops from its conduction potential to a valence band, with relaxation occurring preferentially, under certain conditions, via a photoemissive mechanism. Under this view of the mechanism of operation of typical thin-layer organic devices, the electroluminescent layer comprises a luminescence zone receiving mobile charge carriers (electrons and holes) from each electrode.

An example of a multicolor electroluminescent image display device employing organic compounds for light emitting pixels is disclosed in Tang et al., U.S. Pat. No. 5,294, 870. This patent discloses a plurality of light emitting pixels which contain an organic medium for emitting blue light in subpixel regions. Fluorescent media are laterally spaced from the blue-emitting subpixel region. The fluorescent media absorb light emitted by the organic medium and, in turn, emit red and green light in different subpixel regions. The use of materials doped with fluorescent dyes to emit green or red on absorption of blue light from the blue subpixel region is less efficient than direct formation via green or red LED's. The reason is that the efficiency will be the product of (quantum efficiency for EL) and (quantum efficiency for fluorescence) and (1-transmittance). Thus, a drawback of this display and all displays of this type is that different laterally spaced subpixel regions are required for each color emitted.

SUMMARY OF THE INVENTION

The present invention is generally directed to a multicolor organic light emitting device (OLED), and structures containing the same, employing an emissive layer comprising emitting compounds selected for the transmission of desirable primary colors. Included among these compounds are those disclosed in Applicants' co-pending U.S. patent application Ser. No. 08/693,359, filed Aug. 6, 1996, the disclosure of which is herein incorporated by reference. In particular, the present invention is directed to novel emissive compounds that are capable of demonstrating electroluminescence at desired target wavelengths when used in OLED's, as either homogeneous layers of vacuum deposited materials, or as receiving compounds for dopants co-deposited in layer structures.

The receiving compounds as defined herein are any compounds which can be doped with suitable dopants to emit at the desired wavelengths. Such compounds include, but are not limited to, both emitting compounds and host compounds as described in the U.S. Patent Applications referenced herein.

For example, preferred emitting compounds include compounds according to Formulas I–II:

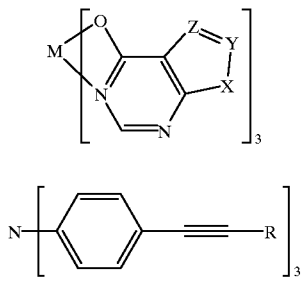

I

II wherein M is a trivalent metal ion of a metal such as Al or Ga; and R is alkyl, phenyl, substituted alkyl, substituted phenyl, trimethylsilyl, or substituted trimethylsilyl; and wherein X, Y, and Z are each individually and independently C or N such that at least two of X, Y and Z are N. Specific examples of compounds according to Formula I are provided in FIG. 5, which are all commercially available species (Aldrich). With respect to compounds according to Formula II, substituted constituents of wide variety may be prepared by reference to the example preparations provided in the Examples herein.

Host compounds which facilitate the carrying of charge or excitation to the emitting compounds to initiate light emission can include compounds of Formulas III–VI as shown below, and in FIGS. 2A–2D:

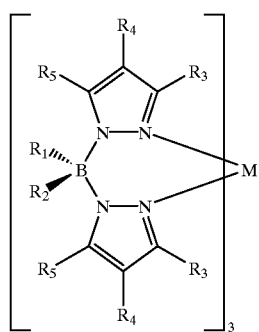

III

-continued

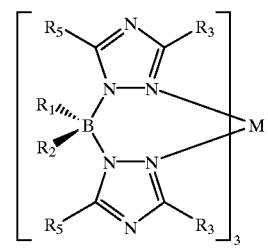

IV

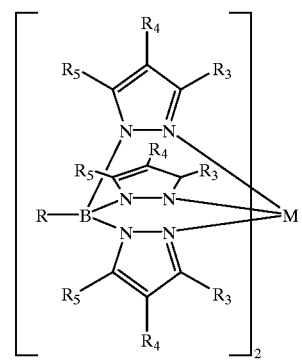

V

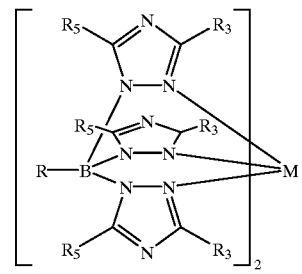

VI wherein M for compounds represented by formulas III and IV is a +3 metal ion, while M for compounds represented by formulas V and VI is a +2 metal ion; and $R_1$ through $R_5$ are each independently selected from the group consisting of hydrogen, alkyl and aryl.

BRIEF DESCRIPTION OF THE DRAWINGS

The following drawings pertaining to the present invention, in which like reference characters indicate like parts, are illustrative of embodiments of the invention, and are not intended to limit the scope of the invention as encompassed by the claims forming part of the application.

DETAILED DESCRIPTION OF THE INVENTION

The present invention is generally directed to emitting compounds that permit the emission of light with target wavelengths from the visible spectrum when such compounds are used within functional layers of organic light emitting devices (OLED's).

In accordance with the present invention, a dopant, capable of shifting the emission wavelength of a compound, is added to a receiving compound in an amount effective to shift the emission wavelength to selected target regions of the visible spectrum. As used herein, the term "receiving compound" shall mean any compound that, when combined with an effective amount of a dopant, emits light in the desired region of the visible spectrum. Examples of suitable receiving compounds including emitting compounds and/or host compounds of the type shown and described in Applicants' co-pending U.S. patent application Ser. No. 08/693,359, filed Aug. 6, 1996.

For example, preferred emitting compounds include compounds according to Formulas I and II:

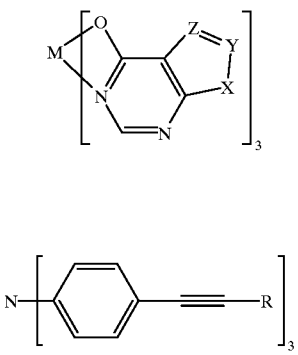

I

Figure 5A:
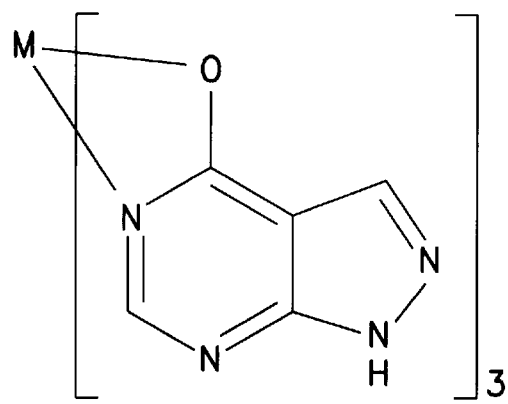
FIG. 5, in parts a) to c), provides specific examples of suitable compounds according to Formula I.
Figure 3A:
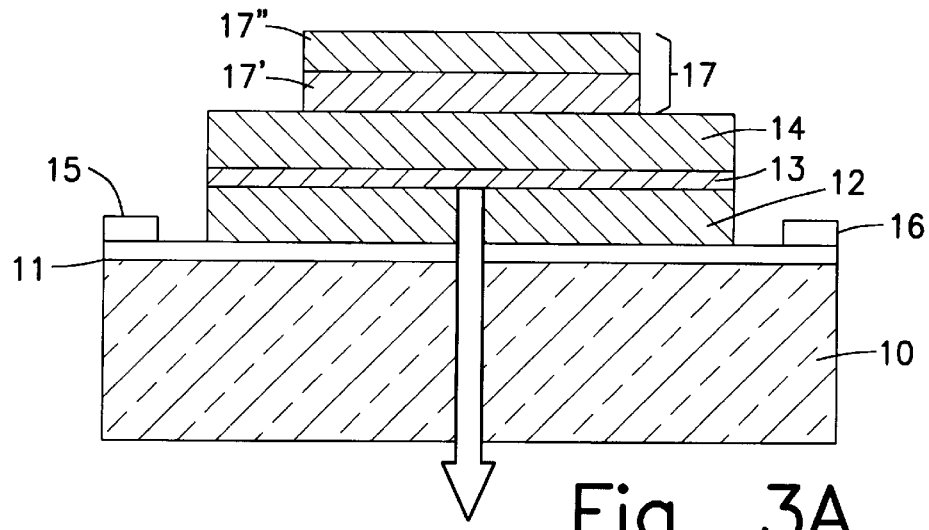
FIG. 3A is a cross-sectional view of a typical organic double heterostructure LED for use with the present invention.
Figure 3B:
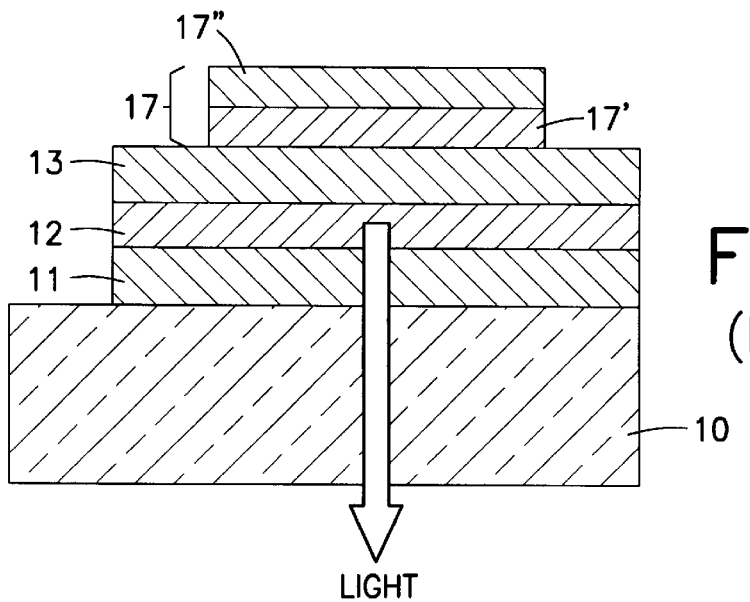
FIG. 3B is a cross-sectional view of a typical organic single heterostructure LED for use with the present invention.
Figure 3C:
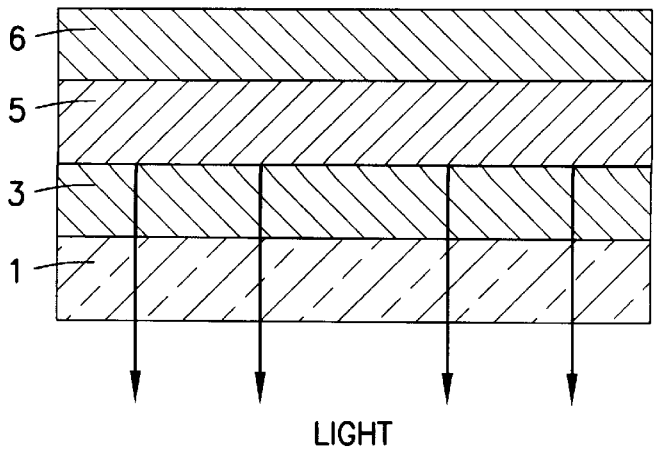
FIG. 3C is a cross-sectional view of a known single-layer polymer LED structure for use with the present invention.
Figure 4:
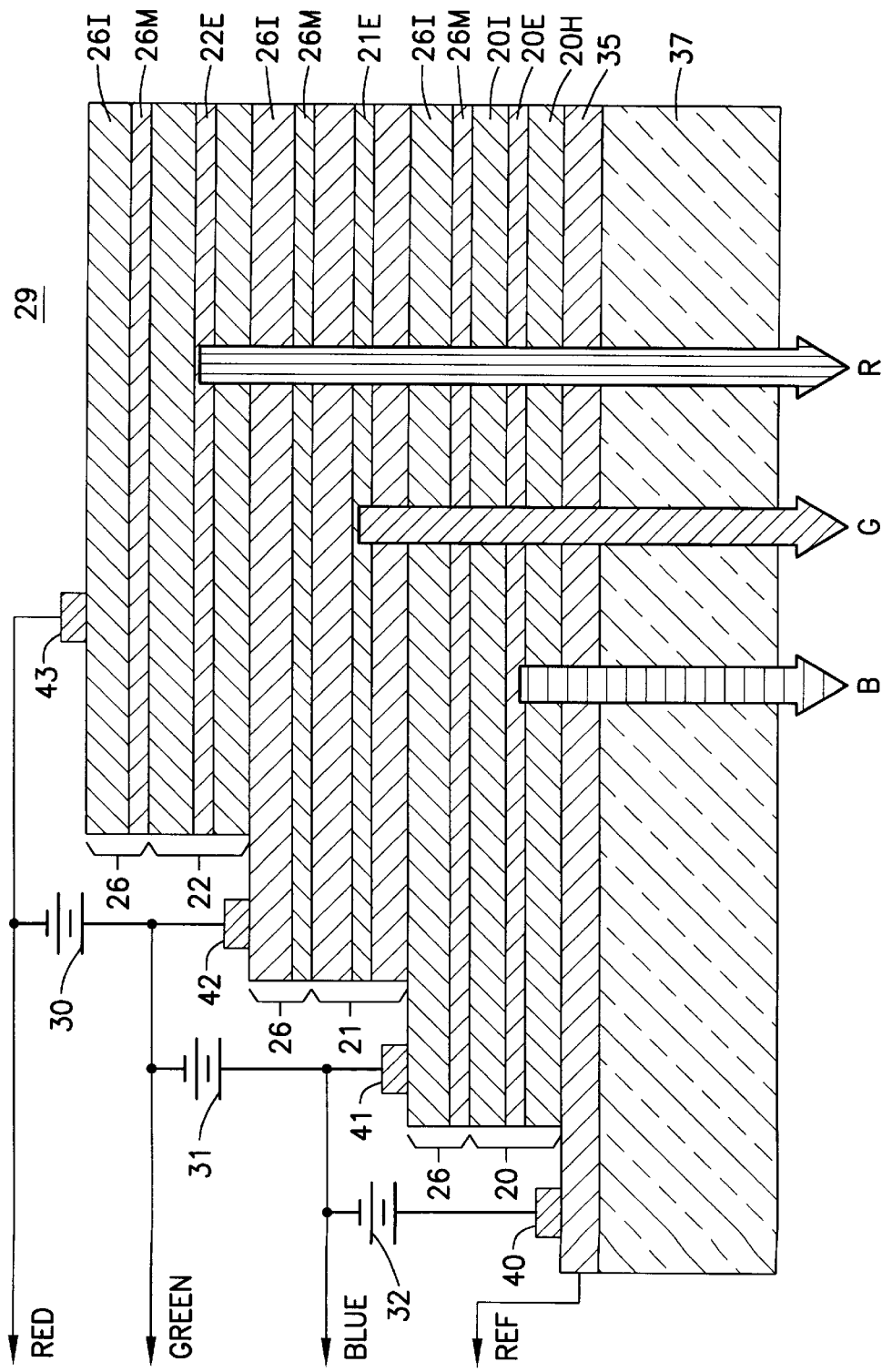
FIG. 4 is a cross-sectional view of an integrated three-color pixel utilizing crystalline organic light emitting devices (LED's) for use with the present invention.
Figure 5B:
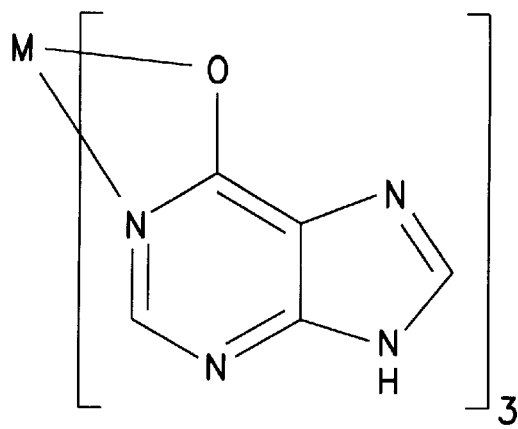
Figure 5C:
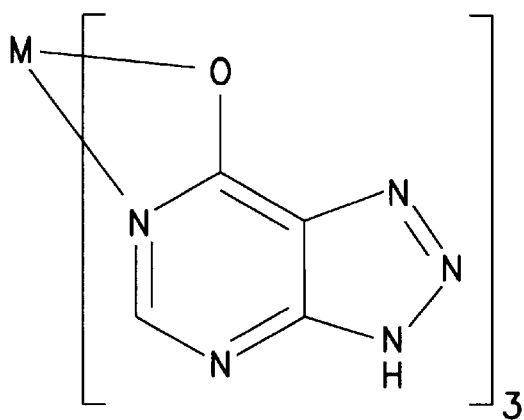

II wherein M is a trivalent metal ion of a metal such as Al or Ga; and R is alkyl, phenyl, substituted alkyl, substituted phenyl, trimethylsilyl, or substituted trimethylsilyl; and wherein X, Y, and Z are each individually and independently C or N, such that at least two of X, Y and Z are N. Specific examples of compounds according to Formula I are provided in FIG. 5, which are all commercially available species (Aldrich).

As discussed above, efforts to fabricate efficient and effective OLED's have met with the greatest success for those devices displaying emission in the green region of the visible spectrum. A frequently used emitting compound utilized in those green-emitting OLED's, as disclosed in a number of United States Patents assigned to Kodak (see, for example U.S. Pat. No. 5,552,678 to Tang et al.), is a quinolate complex of the general formula:

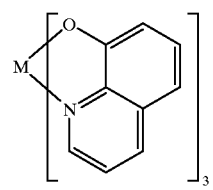

wherein M is a trivalent ion of metals such as aluminum and gallium. An exemplary green-emitting compound according to this general formula would be tris(8-hydroxyquinolato) aluminum, also referred to as $Alq_3$. Compounds of the present invention represented by formulas I and II constitute the result of a rational approach to emitter compound design that seeks to red-shift the emission of such compounds by altering ligand structure and choice. This approach is based on the observation that the incorporation of two nitrogen heteroatoms into the pyridil side of the quinolate ligand results in a shift of emission wavelength of 100 nm relative to the emission from $Alq_3$.

Using this general approach, the compounds of Formulas I have been devised and synthesized with the specific purpose of shifting the emission from $Alq_3$-type receiving compound materials toward shorter wavelengths. The ligand of Formula I is an example of a fused ring, multi-heteroatom structure that offers many of the same structural features of the quinolate-based ligands, yet has an emission shifted considerably from that of $Alq_3$.

The compound represented by Formula II, although not a metal complex, was prepared as a hole conductor for an HTL layer in a multi-layer thin film OLED device structure. However, the compound also exhibits satisfactory emissive characteristics as well. The emissive properties of this compound, as well as a compound of Formula I, are summarized below. Also provided is comparable data for the $Alq_3$ compound as well.

TABLE 1

| Compound | absorption λ | emission λ |
|---|---|---|
| $Alq_3$ | 380 nm | 540 nm |
| I | 280 nm | 390 nm |
| II | 355 nm | 402 nm |

The amount of the emitting compounds of Formulas I and II for use in the present invention is an amount sufficient to achieve the desired emission wavelength of the emitting layer of an OLED. When a dopant species is also used to control the emission properties of the emitting layer, the effective amount of the dopant used is from about 0.01 to 10.0 mol %, based on the emitting layer. The preferred amount is from about 0.1 to 1.0 mol %. However, it will be recognized here that the sole criterion for determining an appropriate doping level is the level effective to achieve an emission with the appropriate spectral characteristics. By way of example, and without limitation, if the amount of dopant species is at too low a level, then emission from the device will also comprise a component of light from the host compound itself, which will be at shorter wavelengths than the desired emission form the dopant species. In contrast, if the level of dopant is too high, emission efficiencies could be adversely affected by self-quenching, a net non-emissive mechanism. Alternatively, too high levels of the dopant species could also adversely affect the hole or electron transporting properties of the host material.

Additional emitting compounds are those covered by Formulas VIII and IX:

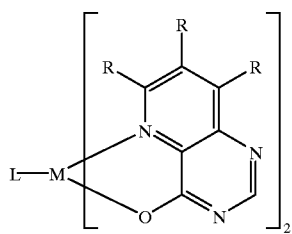

VIII

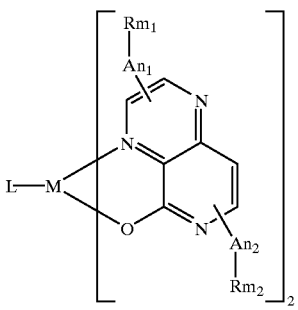

IX wherein

R is selected from the group consisting of hydrogen, an alkyl group, an aryl group, and a heterocyclic group, each of which may be substituted with at least one substituent selected from the group consisting of: aryl, halogen, cyano and alkoxy;

M is a trivalent metal ion;

L is a ligand selected from the group consisting of:
   picolylmethylketone;
   substituted and unsubstituted salicylaldehyde;
   a group of the formula $R^1(O)CO$;
   wherein $R^1$ is selected from the group consisting of:
      hydrogen, an alkyl group, an aryl group, and a heterocyclic group, each of which may be substituted with at least one substituent selected from the group consisting of:
         aryl, halogen, cyano and alkoxy;
      halogen;
      a group of the formula $R^1O$—wherein $R^1$ is as defined above;
      bistriphenyl siloxides;
      and quinolates and derivatives thereof;

A is an aryl group or a nitrogen containing heterocyclic group fused to the existing fused ring structure;

$n_1$, and $n_2$ are independently 0, 1, or 2; and $m_1$ and $m_2$ are independently 1, 2, 3 and 4.

Also encompassed are compounds of Formulas VII and VIII:

X

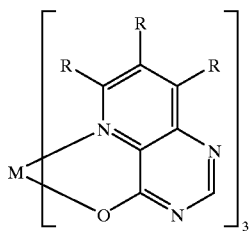

XI

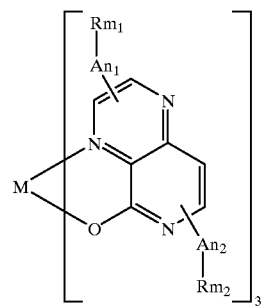

wherein R, M, A, $n_1$, $n_2$, $m_1$, and $m_2$ are as defined above.

The receiver compound also includes host compounds of the type covered by Formulas III–VI:

III

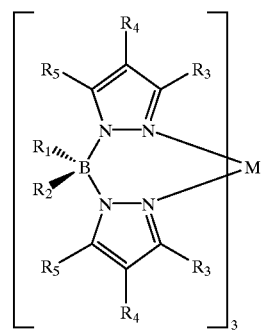

IV

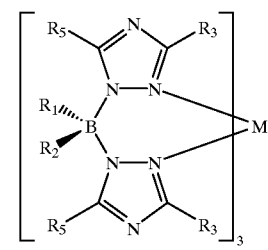

V

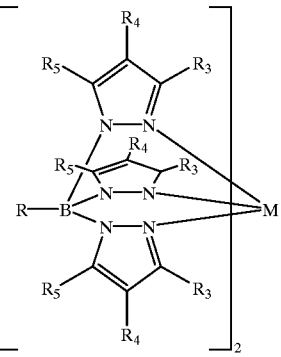

-continued

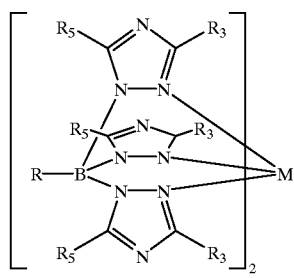

VI

Figure 1A:
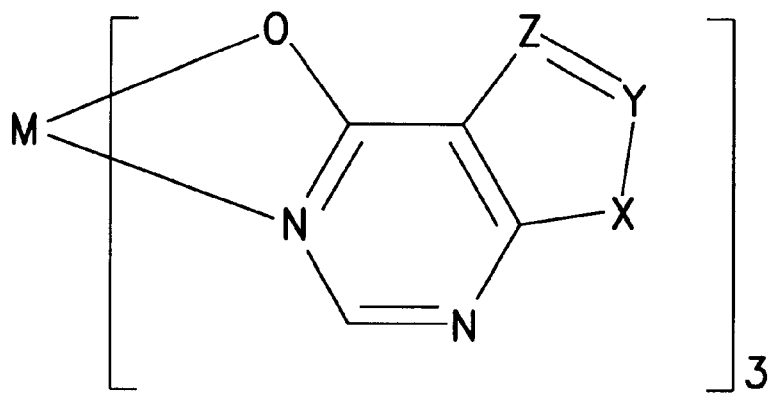
FIGS. 1A and 1B represent the structural formulas of emitter compounds for use in light emitting devices in accordance with the present invention.
Figure 1B:
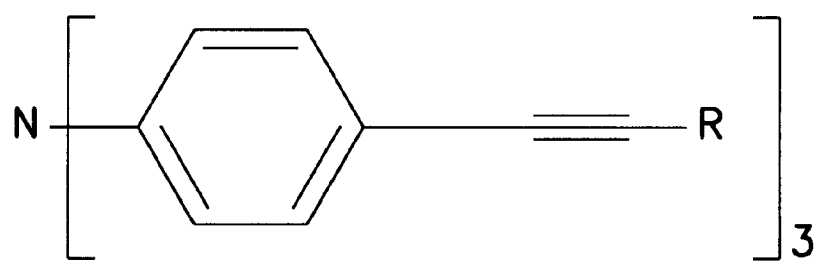
Figure 2:
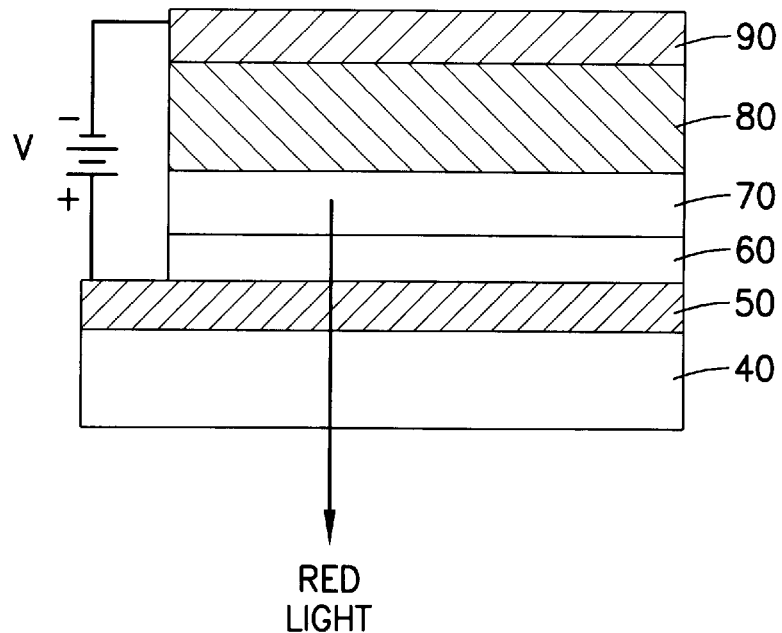
FIG. 2 is a cross-sectional view of an OLED device that can be employed in accordance with the present invention.

FIG. 2 shows a prior art OLED structure that can be utilized with the dopants and the receiver compounds of the present invention to emit saturated red light. A device such as that shown in FIG. 2, when used in the practice of the present invention, would have a 1-mm glass layer 40 coated with 2000 Å of indium-doped tin oxide (ITO) 50 as a device substrate. Deposited on the ITO layer is a 300 Å-thick hole transporting layer (HTL) 60 comprised of a receiver compound such as TPD (N,N'-diphenyl-N,N'-bis(3-methylphenyl)-1,1'-biphenyl-4,4'-diamine). There is then deposited a 500 Å-thick layer of a receiver compound doped with a compound of the present invention 70, at a level of 1 mol %. This structure is then covered by a two-layer electrode, with a Mg:Ag alloy as the first layer 80, covered by Ag 90.

Other device structures which can be used in accordance with the present invention include, but are not limited to, those shown in FIGS. 3A–3C and FIG. 4, each of which are described in detail in Applicants' co-pending application Ser. No. 08/354,674 filed Dec. 13, 1994, incorporated herein by reference.

The subject invention as disclosed herein may be used in conjunction with the subject matter of co-pending applications, "High Reliability, High Efficiency, Integratable Organic Light Emitting Devices and Methods of Producing Same," Attorney Docket No. 10020/1, U.S. Ser. No. 08/774,119; "Electron Transporting And Light Emitting Layers Based On Organic Free Radicals," Attorney Docket No. 10020/3, U.S. Ser. No. 08/774,120; "Multicolor Display Devices," Attorney Docket No. 10020/4, U.S. Ser. No. 08/772,333; "Red-Emitting Organic Light Emitting Devices (LED's)," Attorney Docket No. 10020/5, U.S. Ser. No. 08/774,087; and "High Efficiency Organic Light Emitting Device Structures," Attorney Docket No. 10020/7, U.S. Ser. No. 08/772,332; each of said co-pending being herein incorporated in their entirety by reference. The subject invention may also be used in conjunction with the subject matter of co-pending U.S. Ser. Nos. 08/354,674; 08/613,207; 08/632,316; 08/632,322; 08/693,359; 60/010,013; and 60/024,001; which are also herein incorporated in their entirety by reference.

EXAMPLES

Example 1

Preparation of Compounds of Formula I

A 0.25-g sample of 4-hydroxypyrazolo[3,4-d]pyrimidine is dissolved in 2.5 mL of aqueous 1.1 M NaOH. A solution prepared by dissolving 0.114 g of gallium nitrate in 1.5 mL of water is added slowly to the NaOH solution. A precipitate forms upon addition of the gallium nitrate. The white precipitate was isolated by filtration, washed twice with 5-mL aliquots of ethanol, and air dried. The isolated product, when excited at 250 nm, has an emission maximum at 390 nm.

Example 2

Preparation of Compounds of Formula II

A. Preparation of tris(4-ethylphenyl)amine [$N(C_6H_4CCH)_3$]

A solution of aqueous KOH is prepared by dissolving 1.26 g (0.0225 mol) in methanol. The KOH solution is added to a solution of tris(4-trimetylsilylethynylphenyl)amine that was prepared by adding 2.00 g (0.0038 mol) to 100 mL of tetrahydrofuran (THF), creating an orange solution that was stirred at room temperature for 3 hours. The small amount of orange precipitate that formed was removed by filtering the reaction mixture through Celite. The Celite was washed with two 10-mL portions of THF. The solvent was removed from the combined filtrates in vacuo leaving a gummy beige-orange residue. The residue was triturated with 50 mL of methanol and left to stir for one hour at room temperature. The product (corresponding to Formula II) was obtained as an orange powder that was collected, washed with 2 5-mL portions of pentane and dried in vacuo. Two additional crops were obtained from the filtrates in a similar manner, providing a total yield of 0.746 g (63%). The emission characteristics of the compound at an excitation wavelength of 346 nm, were as follows:

emission (solution): 430 nm emission (solid): 517 nm

B. Preparation of tris(4-trimethylsilylethynil-phenyl)amine [$N(C_6H_4CCSi(CH_3)_3)_3$]

A 100-mL Schenk flask is charged with 1.8 g of trimethylsilylacetylene, 15 mL of diethylamine, 2.0 g of tris(4-bromophenyl)amine, 0.59 g of $PdCl_2$, 0.175 g of triphenylphosphine and 0.032 of copper(II) iodide. The reaction mixture is heated to reflux for 24 hours. The solvent is removed in vacuo, and the residue extracted with 70 mL of benzene, followed by 70 mL of diethylether. Both organic extracts are filtered through alumina, combined and the solvent removed in vacuo. The resulting solid has a melting point of 155–158° C. and shows strong blue fluorescence. Excitation at either 255 or 350 nm gives luminescence centered at 402 nm.

Example 3

Preparation of an OLED According to the Present Invention

A. According to Formula I

A transparent substrate (e.g. glass or plastic) is precoated with an indium tin oxide (ITO) layer having a sheet resistance of about 15 ohm/square. The substrate may be cleaned by thorough rinsing in deionized water, 1,1,1-trichloroethane, acetone and methanol, and dried in pure nitrogen gas between each step. The clean, dry substrate is then transferred to the vacuum deposition system. All organic and metal depositions may then be carried out under high vacuum ($<2 \times 10^{-6}$ torr). Depositions are carried out by thermal evaporation from baffled Ta crucibles at a nominal deposition rate of 2–4 angstroms/second. First, an approximately 350 angstrom layer of N,NI-diphenyl-N,N'-bis(3-methylphenyl)-1,11-biphenyl-4,41-diamine (TPD) may be vapor deposited onto the cleaned ITO substrate. A sample of a compound according to Formula I and a selected fluorescent dye are then heated in separate Ta boats to deposit a film on top of the TPD film that is a mixture of 0.1–10 mole % dye in the receiving compound according to Formula I. The emission color of the OLED will be dictated by the luminescent properties of the dye itself, and can span the entire visible spectrum by appropriate choice of the dye. This mixed film according to the present invention is deposited to a thickness of about 400 Å. An array of circular, 0.25-mm diameter, 1,000-Å electrodes of approximately 10:1 Mg:Ag ratio may be subsequently deposited by co-evaporation from separate Ta boats. A 500 Å-thick layer of Ag may then be added to inhibit atmospheric oxidation of the electrode.

B. According to Formula II

A transparent substrate (e.g. glass or plastic) is precoated with an indium tin oxide (ITO) layer having a sheet resistance of about 15 ohm/square. The substrate may be cleaned by thorough rinsing in deionized water, 1,1,1-trichloroethane, acetone and methanol, and dried in pure nitrogen gas between each step. The clean, dry substrate is then transferred to the vacuum deposition system. All organic and metal depositions may then be carried out under high vacuum ($<2 \times 10^{-6}$ torr). Depositions are carried out by thermal evaporation from baffled Ta crucibles at a nominal deposition rate of 2–4 angstroms/second. First, a sample of a compound according to Formula II and a selected fluorescent dye are heated in separate Ta boats to deposit a film on the cleaned substrate that is a mixture of 0.1–10 mole % dye in compound II. The emission color of the OLED will be dictated by the luminescent properties of the dye itself, and can span the entire visible spectrum by appropriate choice of the dye. This mixed film according to the present invention is deposited to a thickness of about 400 angstroms. Next a film of a suitable hole blocking material is deposited, such as 100 Å of an oxadiazole derivative (e.g. 2-(4-biphenyl)-5-(4-tert-butylphenyl)-1,3,4-oxadiazole), followed by film of an electron transporting material (ca. 300 Å) such as aluminumtris(8-hydroxyquinoline). An array of circular, 0.25-mm diameter, 1,000-Å electrodes of approximately 10:1 Mg:Ag ratio may be subsequently deposited by co-evaporation from separate Ta boats. A 500 Å thick layer of Ag may then be added to inhibit atmospheric oxidation of the electrode.

What is claimed is:

1. A light emitting device (LED) capable of use in an LED structure, the LED comprising:

an emission layer, the emission layer comprising a receiving compound having a structure represented by Formula II:

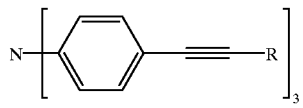

wherein R is alkyl, phenyl, substituted alkyl, substituted phenyl, trimethylsilyl, or substituted trimethylsilyl.

2. A multicolor light emitting device (LED) structure, comprising:

a plurality of at least a first and a second organic light emitting device (LED) stacked one upon the other to form a layered structure, with each LED separated one from the other by a transparent conductive layer to enable each device to receive a separate bias potential to cause an emission of light through the stack, at least one of the LED's comprising an emission layer, the emission layer comprising at least one receiving compound, and an emitting compound having a structure represented by Formula II:

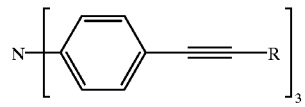

wherein R is alkyl, phenyl, substituted alkyl, substituted phenyl, trimethylsilyl, or substituted trimethylsilyl.

3. A display including a plurality of light emitting devices in accordance with claim 2.

4. A vehicle incorporating a display including the light emitting device of claim 2.

5. A television incorporating a display including the light emitting device of claim 2.

6. A computer incorporating a display including the light emitting device of claim 2.

7. A printer incorporating the light emitting device of claim 2.

8. A screen incorporating the light emitting device of claim 2.

9. A sign incorporating the light emitting device of claim 2.

10. A telecommunications device incorporating the light emitting device of claim 2.

11. A telephone incorporating the light emitting device of claim 2.

* * * * *

UNITED STATES PATENT AND TRADEMARK OFFICE
CERTIFICATE OF CORRECTION

PATENT NO. : 6,045,930  
DATED : April 4, 2000  
INVENTOR(S) : Thompson et al.

Page 1 of 1

It is certified that error appears in the above-identified patent and that said Letters Patent is hereby corrected as shown below:

Column 3,
Line 14, after "HTL layer" change "Is" to -- is -- ;

Column 8,
Line 13, after "tris" change "(8-hydroxyquinolato)" to -- (8-hydroxyquinolate) -- ;

Column 9,
Line 54, after "Formulas" change "VII and VIII" to -- X and XI -- ; and Column 12,
Line 11, after "tris" change "(4-trimetylsilylethynylphenyl)" to -- (4-trimethylsilylethynylphenyl) --.

Signed and Sealed this

Eleventh Day of September, 2001

*Attest:*

*Attesting Officer*

NICHOLAS P. GODICI
*Acting Director of the United States Patent and Trademark Office*